United States Patent
Ji et al.

(10) Patent No.: US 11,114,581 B2
(45) Date of Patent: Sep. 7, 2021

(54) METHOD FOR PRODUCING SOLAR CELL MODULE

(71) Applicant: SHARESUN CO., LTD, Jiangsu (CN)

(72) Inventors: Jingjia Ji, Jiangsu (CN); Fan Zhu, Jiangsu (CN); Yusen Qin, Jiangsu (CN)

(73) Assignee: SHARESUN CO., LTD.

( * ) Notice: Subject to any disclaimer, the term of this patent is extended or adjusted under 35 U.S.C. 154(b) by 350 days.

(21) Appl. No.: 15/525,532

(22) PCT Filed: Nov. 5, 2015

(86) PCT No.: PCT/CN2015/093835
§ 371 (c)(1),
(2) Date: Jul. 25, 2019

(87) PCT Pub. No.: WO2016/078514
PCT Pub. Date: May 26, 2016

(65) Prior Publication Data
US 2020/0251607 A1    Aug. 6, 2020

(30) Foreign Application Priority Data

Nov. 19, 2014 (CN) .......................... 201410658677.4

(51) Int. Cl.
*B23K 1/00* (2006.01)
*H01L 31/18* (2006.01)
(Continued)

(52) U.S. Cl.
CPC .......... *H01L 31/1876* (2013.01); *B23K 1/002* (2013.01); *B23K 1/0016* (2013.01);
(Continued)

(58) Field of Classification Search
CPC ..... H01L 31/1876; H01L 31/05; H01L 31/18; H01L 31/042; B23K 1/0016; B23K 1/002; B23K 1/0053; B23K 2101/40; Y02E 10/50
See application file for complete search history.

(56) References Cited

U.S. PATENT DOCUMENTS

2007/0095387 A1 * 5/2007 Fujii ................... H01L 31/0508
                                                                136/251
2007/0295381 A1 * 12/2007 Fujii ............... H01L 31/022433
                                                                136/244
(Continued)

FOREIGN PATENT DOCUMENTS

DE    102007042082 A1 *   3/2009   ........... B23K 1/0008
DE    102011013928 A1 *   9/2012   ........... B23K 1/0053
(Continued)

*Primary Examiner* — Kiley S Stoner

(57) ABSTRACT

The present invention provides a method for producing a solar cell module; the present invention is characterized in that: in the process of soldering and connecting crystalline silicon solar cells, the crystalline silicon solar cells are kept still at positions on a bottom layer, and soldering and connecting of all crystalline silicon solar cells are implemented by moving a soldering apparatus or by moving the bottom layer; by means of the method for soldering and connecting crystalline silicon solar cells in the present invention, the process of soldering and connecting crystalline silicon solar cells is simplified and accelerated, and meanwhile, problems such as hidden fractures and power attenuation of the module occurring in the process of soldering and connecting solar cells are resolved.

14 Claims, 2 Drawing Sheets

(51) Int. Cl.
*B23K 1/002* (2006.01)
*B23K 1/005* (2006.01)
*H01L 31/05* (2014.01)
*B23K 101/40* (2006.01)

(52) U.S. Cl.
CPC ............ *B23K 1/0053* (2013.01); *H01L 31/05* (2013.01); *B23K 2101/40* (2018.08)

(56) References Cited

U.S. PATENT DOCUMENTS

| | | | | |
|---|---|---|---|---|
| 2008/0173698 A1* | 7/2008 | Marczi | ............... | H05K 3/341 228/180.1 |
| 2009/0236328 A1* | 9/2009 | Dingle | ............... | B23K 3/085 219/616 |
| 2010/0038358 A1* | 2/2010 | Dingle | ............... | B23K 3/085 219/616 |
| 2010/0043860 A1* | 2/2010 | Morita | ............... | H01L 31/188 136/244 |
| 2011/0062148 A1* | 3/2011 | Kumaria | ............... | B23K 1/002 219/616 |
| 2012/0031895 A1* | 2/2012 | Makacs | ............... | B23K 1/002 219/616 |
| 2013/0277361 A1* | 10/2013 | Tan | ............... | B23K 1/0016 219/616 |
| 2014/0060615 A1* | 3/2014 | Gretler | ............... | H01L 31/0516 136/244 |
| 2015/0004737 A1* | 1/2015 | Harley | ............... | H01L 31/0516 438/64 |
| 2015/0048078 A1* | 2/2015 | Morf | ............... | B23K 1/002 219/616 |
| 2015/0179855 A1* | 6/2015 | Huang | ............... | H01L 25/043 136/246 |
| 2015/0280643 A1* | 10/2015 | Okawa | ............... | H02S 50/10 136/244 |
| 2016/0027933 A1* | 1/2016 | Lu | ............... | B23K 1/008 228/180.21 |
| 2016/0118530 A1* | 4/2016 | Ji | ............... | H01L 31/0516 438/66 |
| 2017/0236964 A1* | 8/2017 | Arima | ............... | H01L 31/0508 136/244 |
| 2017/0365731 A1* | 12/2017 | Lin | ............... | H01L 31/0512 |

FOREIGN PATENT DOCUMENTS

| | | | | | |
|---|---|---|---|---|---|
| EP | 1748495 | A1 | * | 1/2007 | ........... B23K 3/0475 |
| EP | 2415547 | A2 | * | 2/2012 | ............. B23K 1/002 |
| JP | 2007221138 | A | * | 8/2007 | ............. H01L 31/05 |
| WO | WO-2010027265 | A2 | * | 3/2010 | ............. H01L 31/18 |
| WO | WO-2014190854 | A1 | * | 12/2014 | ......... H01L 31/0504 |

* cited by examiner

METHOD FOR PRODUCING SOLAR CELL MODULE

TECHNICAL FIELD OF THE INVENTION

The present invention relates to a method for producing a crystalline silicon solar cell module, and more particularly, to a method for soldering and connecting the solar cells. Through this method, the process of soldering and connecting crystalline silicon solar cells is greatly simplified and accelerated. Meanwhile, problems such as hidden fractures and power loss of the module occurring in the process of soldering and connecting solar cells are solved.

BACKGROUND OF THE INVENTION

A traditional method for producing a solar cell module is to manually or automatically solder and connect the crystalline solar cells into cell strings through the connecting strips according to the design requirements of the crystalline silicon solar cell module. Subsequently, a number of crystalline silicon solar cell strings is connected in a series, thereby forming a solar cell module.

However, such a traditional method for producing a solar cell module has the following shortcomings: First, during the process of producing a solar cell module, the crystalline silicon solar cells must be moved several times. For instance, when automatically series-soldering the solar cells, those to be soldered first must be continuously moved towards one direction because the soldering apparatus is placed at a specific position, thereby allowing the subsequent solar cells to be continuously soldered.

Second, in order to reduce the manufacturing cost of a crystalline silicon solar cell, the thickness of the crystalline silicon solar cell is constantly being reduced. Under this circumstance, the crystalline silicon solar cell can easily be fractured during the multiple movements.

Third, the traditional method of producing a crystalline silicon solar cell module comprises complicated steps, resulting in an inefficient manufacturing process. For example, when performing the automatic soldering and connecting process, the crystalline silicon solar cells are firstly soldered into cell strings. Subsequently, these cell strings are taken out from the automatic soldering machine, and moved onto an overlapping layer composed of glass and EVA. Finally, these cell strings are manually connected in series.

During the above process, these crystalline silicon solar cell strings need to be moved multiple times, leading to problems such as low production efficiency and hidden fractures of the crystalline silicon solar cells. Furthermore, the traditional method must be assisted by a large amount of automatic operation, resulting in heavy investments in equipment and production area.

SUMMARY OF THE INVENTION

One purpose of the present invention is to provide a simple method for soldering and connecting crystalline silicon solar cells, which solders and connects all of the crystalline silicon solar cells of a crystalline silicon solar cell module simultaneously. According to this method, the manufacturing process can be greatly simplified and the efficiency of producing crystalline silicon solar cell modules can be significantly improved.

The present invention further seeks to provide a method for soldering and connecting crystalline silicon solar cells, which can reduce the times of moving the crystalline silicon solar cells during the soldering and connecting process, thereby lowering the risk of fracturing the crystalline silicon solar cells during the process of moving them.

Another purpose of the present invention is to reduce the power loss from the cells to the module while simplifying the producing process of the crystalline silicon solar cell modules, and lowering the risk of fracturing the crystalline silicon solar cells.

To achieve the above purpose, the present invention adopts the following technical solution:

A method for soldering and connecting crystalline silicon solar cells, wherein all of the crystalline silicon solar cells required by a crystalline silicon solar cell module and the corresponding connecting strips are firstly positioned on a bottom layer; subsequently, the crystalline silicon solar cells are soldered and connected.

In the above process of soldering and connecting crystalline silicon solar cells, the crystalline silicon solar cells are kept still at positions on the bottom layer, and soldering and connecting of all crystalline silicon solar cells can be implemented by moving a soldering apparatus or by moving the bottom layer.

Compared with the prior art, the present invention has the following advantages:

First, according to the method for soldering and connecting crystalline silicon solar cells of the present invention, the number of times that must move the crystalline silicon solar cells is be greatly reduced, thereby lowering the risk of fracturing the crystalline silicon solar cells. For instance, when using the traditional method to produce a crystalline silicon solar cell module composed of sixty crystalline silicon solar cells, these solar cells are first soldered and connected into six cell strings, wherein each string comprises ten solar cells. In this process, the first solar cell of each string needs to be moved at least ten times. Subsequently, the cell strings are moved out from the series-soldering machine, and placed onto the EVA layer of the module. Thus, in such a traditional process, there are six solar cells that need to be moved at least for eleven times. Compared with the prior art, the solar cells only need to be moved once or twice, under the present invention. Consequently, the risk of fracturing the crystalline silicon solar cells in the process of soldering and connecting them can be significantly lowered.

Second, the method of the present invention effectively simplifies the process of soldering and connecting crystalline silicon solar cells in the production of a crystalline silicon solar cell module. Consequently, the crystalline silicon solar cells can be protected from being fractured during the soldering and connecting process, the soldering and connecting equipment can be simplified, and the manufacturing cost can be reduced.

Third, according to the method of the present invention, the adhesion requirements of between the metal grid lines and the crystalline silicon solar cell can be reduced. In some embodiments, the crystalline silicon solar cells can be kept still after being soldered and connected. Therefore, there's no tensile force produced between the connecting strips and the metal grid lines of the cells. Thus, the adhesion requirements between the metal grid line and crystalline silicon solar cell can be reduced.

Fourth, while enabling the metal grid lines to bear less tensile force, the soldering and connecting method of the present invention also provides a necessary condition for using connecting strips having a greater thickness. When connecting strips having a greater thickness are used in the traditional soldering and connecting process, for example, a thickness greater than 0.25 mm, hidden fractures may easily occur to the edge of the cells during the movement of the cell strings. In the process of the present invention, the cells can be moved no more than one time, or even be kept still after being soldered and connected. Consequently, hidden fractures caused by the stress can be prevented from occurring to the edge of the cell.

DETAILED DESCRIPTION OF THE INVENTION

Drawings and detailed embodiments are combined hereinafter to elaborate the technical principles of the present invention.

In the process of soldering and connecting crystalline silicon solar cells of the present invention, all of the crystalline silicon solar cells required by a crystalline silicon solar cell module and the corresponding connecting strips are firstly positioned on a bottom layer according to the design requirements of the crystalline silicon solar cell module. Subsequently, all of the crystalline silicon solar cells are soldered and connected.

Figure 1:
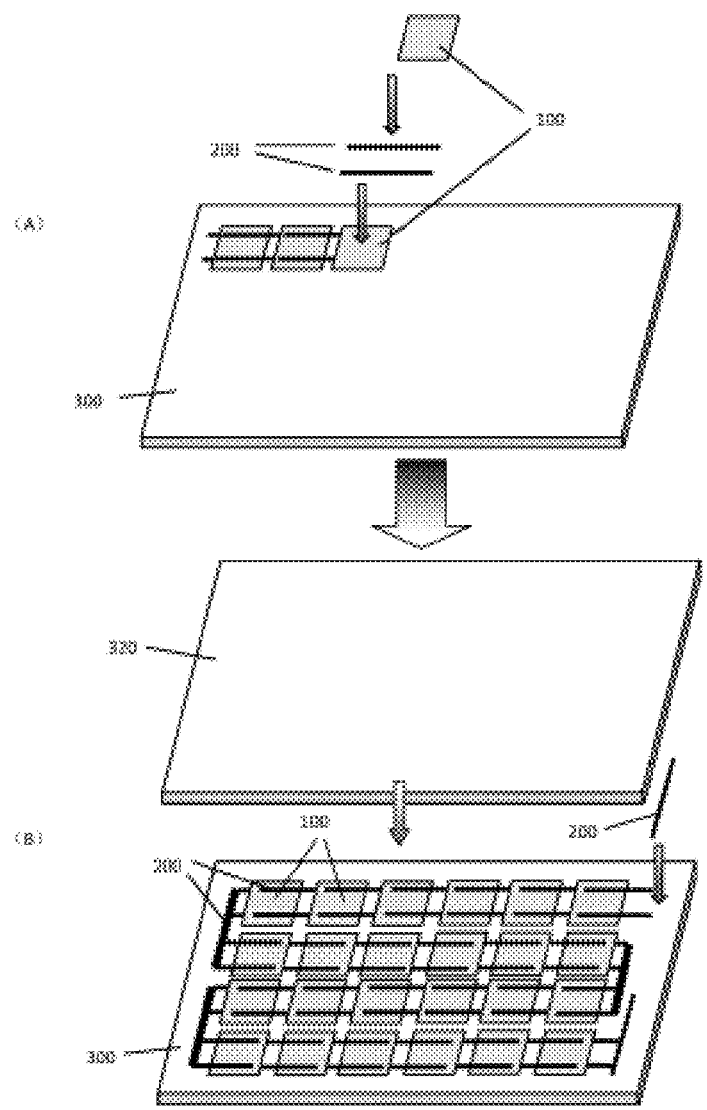
FIG. 1 is a schematic diagram illustrating the positioning process of the crystalline silicon solar cells.

As shown in FIG. 1, first, the connecting strip 200 is positioned on the bottom layer 300 according to the design requirements of the crystalline silicon solar cell module, the design requirements include but are not limited to: number of the connecting strips, distance between the connecting strips, and direction of the connecting strips, etc.

In some applications, the bottom layer 300 is composed of a monolayer material, and in some applications, the bottom layer 300 is an overlapping layer, namely, a layer composed of multilayer materials. In other applications, the bottom layer 300 is provided with a number of slots used for assisting the positioning of the connecting strips, or provided with a number of vacuum holes used for sucking the crystalline silicon solar cells. Further, the bottom layer 300 can be made from the encapsulating materials of the crystalline silicon solar cell module, for example, a bottom layer 300 composed of glass and EVA. Thus, the laminating process can be performed after implementing the soldering and connecting process of all of the crystalline silicon solar cells.

In the process of the present invention, a crystalline silicon solar cell 100 is positioned on the corresponding connecting strips that are pre-positioned on the bottom layer 300. Generally, the connecting strips are positioned to align to the main grid lines of the crystalline silicon solar cell 100. In some situations, for example, to a crystalline silicon solar cell having no main grid line, the connecting strips can be freely disposed so long as a nice appearance can be satisfied. According to various designs of producing a crystalline silicon solar cell module, in some situations, the light-receiving surface of the crystalline silicon solar cell 100 can be placed upward, and in some situations, the light-receiving surface of the crystalline silicon solar cell 100 can be placed downward. Subsequently, the connecting strips 200 and the crystalline silicon solar cells 100 are continuously positioned onto the bottom layer 300 until all crystalline silicon solar cells of a crystalline silicon solar cell module and the corresponding connecting strips 200 are positioned. According to various design requirements, the connecting strips 200 and the crystalline silicon solar cells 100 can be connected in series, or in a combination of series and parallel.

Once all of the crystalline silicon solar cells 100 of a crystalline silicon solar cell module and the corresponding connecting strips 200 are positioned on the bottom layer 300, as shown in FIG. 1, a top layer 320 is placed in the last step. In some applications, the top layer 320 is composed of a monolayer material, and in some applications, the top layer 320 is an overlapping layer, namely, a layer composed of multilayer materials.

Figure 2:
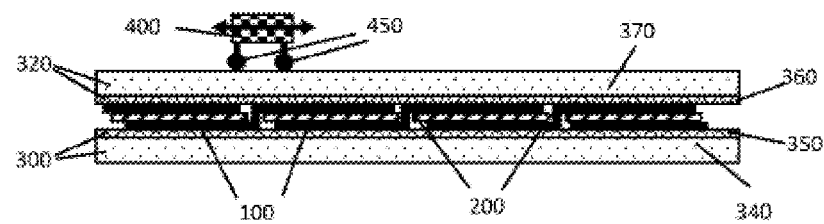
FIG. 2 is a sectional view of an embodiment of performing a non-contact soldering and connecting process to the crystalline silicon solar cells.

FIG. 2 shows an embodiment of the present invention, wherein the bottom layer 300 is composed of a layer of flexible material 350 and a layer of rigid material 340. One purpose of using the flexible material 350 is to lower the risk of fracturing the crystalline silicon solar cells 100 in the positioning and soldering process. When all of the crystalline silicon solar cells 100 required by a crystalline silicon solar cell module and the corresponding connecting strips 200 are positioned on the bottom layer 300, or, positioned on the flexible material 350, the top layer 320 can be subsequently disposed thereon. In this embodiment, the top layer 320 comprises the flexible material 360 and the rigid material 370. Similarly, the flexible material 360 is used to reduce the risk of fracturing the crystalline silicon solar cells 100 in the soldering and connecting process.

After the crystalline silicon solar cells 100 required by a crystalline silicon solar cell module and the corresponding connecting strips 200 are positioned, and the flexible material 350 and the rigid material 370 are placed on the connecting strips 200, the process of non-contact soldering and connecting crystalline silicon solar cells can be performed. The apparatus 400 is a non-contact soldering apparatus. For instance, the apparatus 400 can be an infrared non-contact soldering apparatus, an microwave non-contact soldering apparatus, or an electro-magnetic induction non-contact soldering apparatus. When the apparatus 400 is an infrared non-contact soldering apparatus, the flexible material 360 and the rigid material 370 must be a transparent material, such as glass or transparent flexible polymer material; when the apparatus 400 is an electro-magnetic induction non-contact soldering apparatus, or a microwave non-contact soldering apparatus, the flexible material 360 and the rigid material 370 can be either a transparent material or a nontransparent rigid material, such as ceramics or nontransparent rubber, etc.

As shown in FIG. 2, a pressing roller wheel 450 is used to impose a contact-type external pressure onto the rigid material 370. After being pressed by the pressing roller wheel 450, the rigid material 370 further imposes a pressure onto the connecting strips through the flexible material 360, thereby ensuring a good contact between the connecting strips 200 and the metal grid lines of the crystalline silicon solar cell 100. In this way, the metal grid lines of the crystalline solar silicon cell 100 can be better wetted by the tin alloys melted after the connecting strips 200 are heated, or the crystalline silicon solar cells are heated. Consequently, the soldering and connecting process of the crystalline silicon solar cells can be implemented.

In other embodiments, weight of the top rigid material 370 can be heavy enough to impose a pressure onto the connecting strips through the flexible material 360, thereby ensuring a good contact between the connecting strips 200 and the metal grid lines of the crystalline silicon solar cell 100. In this way, the metal grid lines of the crystalline solar silicon cell 100 can be better wetted by the tin alloys melted after the connecting strips 200 are heated, or the crystalline silicon solar cells are heated. Consequently, the soldering and connecting process of the crystalline silicon solar cells can be implemented. Through the front, rear, left and right movements of the apparatus 400, or through the simultaneous front, rear, left and right movements of the bottom layer 300 and the top layer 320, the soldering and connecting process of the pre-positioned crystalline silicon solar cells 100 of a crystalline silicon solar cell module and the corresponding connecting strips can be implemented. When using the non-contact soldering and connecting apparatus 400 to solder and connect the crystalline silicon solar cells 100, as the positions of all crystalline silicon solar cells 100 and the connecting strips 200 are fixed, the soldering area can be freely determined according to the characteristics of the apparatus 400 and the design of the soldering equipment. For instance, the soldering area can be reduced into a point for lowering the thermal stress caused by the different heat expansion coefficients of the crystalline silicon solar cells 100 and the connecting strips 200, or can be enlarged to an area defined by a main grid line of the crystalline silicon solar cell 100, or can be as large as the area of a crystalline silicon solar cell, or can be even larger than the area of a crystalline silicon solar cell.

Once the process of soldering and connecting all of the crystalline silicon solar cells 100 is implemented, the rigid material 370 and the flexible material 360 can be removed, enabling all of the crystalline silicon solar cells of a crystalline silicon solar cell module to be transferred onto the glass panel and the lower EVA layer of the module in one time. After the soldered crystalline silicon solar cells 100 are covered by the upper EVA layer and the back-panel of the module, the laminating process of producing a crystalline silicon solar cell module can be performed.

Further, when glass is used as the rigid material 340, and EVA is used as the flexible material 350 in this embodiment, the EVA layer and the back-panel of the module can be used to respectively replace the upper flexible material 360 and the upper rigid material 370 after the soldering and connecting process of all crystalline silicon solar cells 100 is implemented. Thus, the laminating process of producing a crystalline silicon solar cell module can be directly performed.

Figure 3:
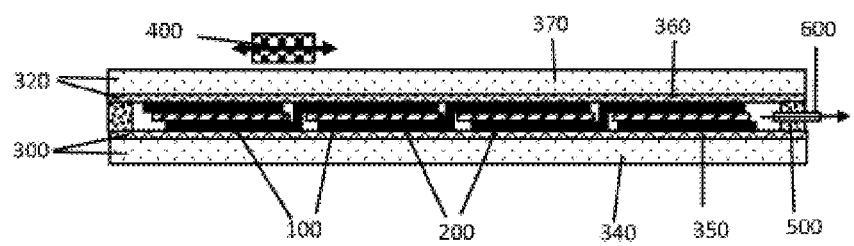
FIG. 3 is a sectional view of an optimized embodiment of performing a non-contact soldering and connecting process to the crystalline silicon solar cells.

FIG. 3 shows an optimized embodiment of the present invention, wherein the bottom layer 300 is composed of a layer of flexible material 350 and a layer of rigid material 340. One purpose of using the flexible material 350 is to lower the risk of fracturing the crystalline silicon solar cells 100 in the positioning and soldering process. Once all of the crystalline silicon solar cells 100 required by a crystalline silicon solar cell module and the corresponding connecting strips 200 are positioned on the bottom layer 300, or, positioned on the flexible material 350, the top layer 320 can be subsequently disposed thereon. In this embodiment, the top layer 320 comprises the flexible material 360 and the rigid material 370. Similarly, the flexible material 360 is used to reduce the risk of fracturing the crystalline silicon solar cells 100 in the soldering and connecting process.

Once the crystalline silicon solar cells 100 required by a crystalline silicon solar cell module and the corresponding connecting strips 200 are positioned, and the flexible material 350 and the rigid material 370 of the top layer are disposed on the connecting strips 200, the process of non-contact soldering and connecting the crystalline silicon solar cells can be performed.

Unlike the embodiment shown in FIG. 2, a sealing ring 500 is placed around the periphery between the bottom layer 300 and the top layer 320 in this embodiment. Subsequently, the space between the bottom layer 300 and the top layer 320 is vacuumed through the vacuum hole 600. Namely, after vacuuming through the vacuum hole 600, the gas pressure between the top layer 320 and the bottom layer 300 is lower than the atmospheric pressure. Under the action of the atmospheric pressure, a pressure is uniformly imposed on the connecting strips 200 through the top layer 320 and the bottom layer 300, enabling the connecting strips 200 to be tightly attached to the metal grid lines of the crystalline silicon solar cells 100. Thus, during the process of soldering and connecting the crystalline silicon solar cells 100, the tin alloy of the connecting strips 200 is melted to wet the metal grid lines, and solidifies on the metal grind lines of the crystalline silicon solar cell 100, ensuring the soldering and connecting process is effectively performed.

The apparatus 400 is a non-contact soldering apparatus. For instance, the apparatus 400 can be an infrared non-contact soldering apparatus, a microwave soldering apparatus, or an electro-magnetic induction non-contact soldering apparatus. When the apparatus 400 is an infrared non-contact soldering apparatus, the flexible material 360 and the rigid material 370 must be a transparent material, such as glass or transparent flexible polymer material; when the apparatus 400 is a microwave non-contact soldering apparatus, or an electro-magnetic induction non-contact soldering apparatus, the flexible material 360 and the rigid material 370 can be either a transparent material or a nontransparent rigid material, such as ceramics or nontransparent rubber, etc.

Through the front, rear, left and right movements of the apparatus 400, or through the simultaneous front, rear, left and right movements of the bottom layer 300 and the top layer 320, the soldering and connecting process of the pre-positioned crystalline silicon solar cells 100 of a crystalline silicon solar cell module and the corresponding connecting strips 200 can be implemented. When using the non-contact soldering and connecting apparatus 400 to solder and connect the crystalline silicon solar cells 100, as the positions of all crystalline silicon solar cells 100 and the connecting strips 200 are fixed, the soldering area can be freely determined according to the characteristics of the apparatus 400 and the design of the soldering equipment. For instance, the soldering area can be reduced into a point for lowering the thermal stress caused by the different heat expansion coefficients of the crystalline silicon solar cells 100 and the connecting strips 200, or can be enlarged to an area defined by a main grid line of the crystalline silicon solar cell 100, or can be as large as the area of a crystalline silicon solar cell, or can be even larger than the area of a crystalline silicon solar cell.

Once the process of soldering and connecting the crystalline silicon solar cells 100 is implemented, the rigid material 370 and the flexible material 360 can be removed, enabling all of the crystalline silicon solar cells of a crystalline silicon solar cell module to be transferred onto the glass panel and the lower EVA layer of the module in one time. After the soldered crystalline silicon solar cells 100 are covered by the upper EVA layer and the back-panel of the module, the laminating process of producing a crystalline silicon solar cell module can be performed.

Further, when glass is used as the rigid material 340, and EVA is used as the flexible material 350 in this embodiment, the EVA layer and the back-panel of the module can be used to respectively replace the upper flexible material 360 and the upper rigid material 370 after the soldering and connecting process of all crystalline silicon solar cells 100 is implemented. Thus, the laminating process of producing a crystalline silicon solar cell module can be directly performed, saving the transferring process of the soldered crystalline silicon solar cells 100.

Further, when glass is used as the rigid materials 340 and 370, and EVA is used as the soft materials 350 and 360 in this embodiment, the laminating process can be directly performed without replacing the upper substrate 320 and the upper flexible substrate 360 after implementing the process of soldering and connecting all of the crystalline silicon solar cells 100. Thus, a two-sided glass crystalline silicon solar cell module can be produced.

The invention claimed is:

1. A method for producing a crystalline silicon solar cell module, wherein crystalline silicon solar cells required by a crystalline silicon solar cell module and corresponding connecting strips are first positioned according to design arrangement of the crystalline silicon solar cell module, and subsequently the crystalline silicon solar cells are soldered and connected via a non-contact soldering and connecting method, comprising the steps of:
   (1) positioning the crystalline silicon solar cells and the corresponding connecting strips on a bottom layer;
   (2) placing a top layer on the crystalline silicon solar cells and the corresponding connecting strips;
   (3) utilizing weight of the top layer or external pressure to enable the connecting strips to be attached to metal grid lines of the crystalline silicon solar cells; and
   (4) soldering and connecting all of the crystalline silicon solar cells via a non-contact soldering and connecting method.

2. The method for producing a crystalline silicon solar cell module of claim 1, wherein all of the crystalline silicon solar cells required by a crystalline silicon solar cell module and the corresponding connecting strips are positioned at once.

3. The method for producing a crystalline silicon solar cell module of claim 1, wherein the bottom layer and the top layer are respectively composed of at least one layer of material.

4. The method for producing a crystalline silicon solar cell module of claim 3, wherein the bottom layer and the top layer are respectively composed of a layer of rigid material and a layer of flexible material.

5. The method for producing a crystalline silicon solar cell module of claim 4, wherein the rigid material is glass, and the flexible material is an encapsulating material of the crystalline silicon solar cell module.

6. The method for producing a crystalline silicon solar cell module of claim 1, wherein the connecting strips are attached to the metal grid lines of the crystalline silicon solar cells through weight of the top layer or external pressure.

7. The method for producing a crystalline silicon solar cell module of claim 1, wherein a contact-type external pressure is imposed onto the top layer, or a contact-type external pressure is simultaneously imposed onto the bottom layer and the top layer, thereby enabling the connecting strips to be attached to the metal grid lines of the crystalline silicon solar cells.

8. The method for producing a crystalline silicon solar cell module of claim 1, wherein a space between the bottom layer and the top layer is vacuumed, thereby enabling the connecting strips to be attached to the metal grid lines of the solar cells through pressure difference between internal pressure of the bottom layer and the top layer and the external pressure of the bottom layer and the top layer.

9. The method for producing a crystalline silicon solar cell module of claim 1, wherein the non-contact soldering method is an infrared heating soldering method, or a microwave heating soldering method, or an electro-magnetic induction heating soldering method.

10. The method for producing a crystalline silicon solar cell module of claim 1, wherein the non-contact soldering method is to solder and connect of all of the crystalline silicon solar cells by moving the non-contact soldering apparatus, or by simultaneously moving the bottom layer and the top layer while keeping the positions of the crystalline silicon solar cells unmoved relative to the bottom layer and the top layer.

11. The method for producing a crystalline silicon solar cell module of claim 2, wherein the bottom layer and the top layer are respectively composed of at least one layer of material.

12. The method for producing a crystalline silicon solar cell module of claim 6, wherein a contact-type external pressure is imposed onto the top layer, or a contact-type external pressure is simultaneously imposed onto the bottom layer and the top layer, thereby enabling the connecting strips to be tightly attached to the metal grid lines of the crystalline silicon solar cells.

13. The method for producing a crystalline silicon solar cell module of claim 6, wherein a space between the bottom layer and the top layer is vacuumed, thereby enabling the connecting strips to be attached to the metal grid lines of the solar cells through pressure difference between internal pressure of the bottom layer and the top layer and the external pressure of the bottom layer and the top layer.

14. The method for producing a crystalline silicon solar cell module of claim 9, wherein the non-contact soldering method is to solder and connect of all of the crystalline silicon solar cells by moving the non-contact soldering apparatus, or by simultaneously moving the bottom layer and the top layer while keeping the positions of the crystalline silicon solar cells unmoved relative to the bottom layer and the top layer.

* * * * *